(12) United States Patent
Barrientos et al.

(10) Patent No.: US 6,820,247 B1
(45) Date of Patent: Nov. 16, 2004

(54) METHOD AND APPARATUS FOR CONSTRUCTING A GLOBAL INTERCONNECT MODEL OF A DEVICE HAVING AMBIGUOUS SUBMODULE ABUTMENTS

(75) Inventors: Carlo E. Barrientos, Pflugerville, TX (US); Peter J. Hannan, Austin, TX (US); Christopher C. Sander, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 967 days.

(21) Appl. No.: 09/593,906

(22) Filed: Jun. 14, 2000

(51) Int. Cl.$^7$ ................................................ G06F 17/50
(52) U.S. Cl. ................................................ 716/13; 716/10
(58) Field of Search .............................. 716/1, 2, 7, 5, 716/8, 10, 11, 12, 13, 16, 4, 6

(56) References Cited

U.S. PATENT DOCUMENTS

| | | | | |
|---|---|---|---|---|
| 5,757,658 A | * | 5/1998 | Rodman et al. | 716/10 |
| 6,131,182 A | * | 10/2000 | Beakes et al. | 716/8 |
| 6,671,866 B2 | * | 12/2003 | Arsintescu | 716/10 |

* cited by examiner

*Primary Examiner*—Leigh M. Garbowski
(74) *Attorney, Agent, or Firm*—Williams, Morgan & Amerson

(57) ABSTRACT

A method for constructing a global interconnect model of a device having ambiguous abutments between submodules includes generating a discrete model for each of the submodules, identifying interconnections between the submodules, and defining a plurality of global abutment points for the interconnections between the submodules. Each global abutment point specifies a locus of interconnection points along at least a portion of a boundary of a particular one of the submodules. The discrete models are stitched together based on the global abutment points to construct a global model.

29 Claims, 6 Drawing Sheets

METHOD AND APPARATUS FOR CONSTRUCTING A GLOBAL INTERCONNECT MODEL OF A DEVICE HAVING AMBIGUOUS SUBMODULE ABUTMENTS

BACKGROUND OF THE INVENTION

1. Field of the Invention

This invention relates generally to semiconductor device design, and, more particularly, to method and apparatus for constructing a global interconnect model of a device having ambiguous submodule abutments.

2. Description of the Related Art

Integrated circuit devices, such as very large scale integrated (VLSI) circuits, include a plurality of submodules on a single semiconductor chip, or die, that cooperate to perform the functions of the device. Microprocessors are common devices of this type. VLSI circuit design typically involves determining the submodules that are necessary in the device and generating a high-level layout diagram, or floor plan, of the device. Subsequently, the detailed implementation of the submodules are completed within the constraints of the floor plan. Eventually, the submodules are interconnected to complete the design of the device. The electrical characteristics of the device, from a global perspective, are commonly referred to as a global interconnect model. The global interconnect model evaluates the resistive and capacitive (RC) characteristics of the device.

Currently, the full chip timing analysis of the global interconnect characteristics of the chip is often postponed until near the end of the design cycle. Typically, VLSI design requires a large team of chip designers that must complete the physical design of the underlying subcircuitry for each submodule before a timing analysis can be completed. The global interconnect analysis may not be completed earlier in the design process due to the inherent uncertainty (fuzziness) in the physical footprint of each submodule that occurs as the submodule designs progress to completion. Common extraction tools used to generate global interconnect models require that the interconnections between submodules be defined exactly. Both of the interfacing submodules must have exactly the same interface physical locations. If the interface locations do not match exactly, an error condition is generated and the submodules are not seen as being interconnected. Hence, designers have to wait until all the physical parameters of all of the submodules reach a stable and complete state (i.e., nearly finished) before they can begin to analyze the timing of the global interconnect between the submodules.

Because, the global interconnect analysis is critical in predicting clock frequency, waiting until the design is finished increases business-related risks. In addition, if the global interconnect analysis uncovers problems that require changes in the underlying subcircuitry, large delays in the development of the device can result. The inability to model the global interconnect characteristics of the device has led some design teams to postpone the global interconnect timing analysis until after the chip has gone to manufacturing or to eliminate the interconnect timing analysis entirely.

The physical points where submodules interface are referred to as abutment points. Abutment points between submodules (i.e., the interconnect "footprints") are assigned using two pins, one in each submodule, with two related, but absolutely fixed, locations (e.g., X, Y, and layer) along the edges of the submodules. These "edge pins" are required to "touch" for proper abutment, and such an absolute connection is required to allow commonly available parametric extraction tools to obtain an interconnect model (RC model) for the entire global interconnect. Submodules without proper abutment result in network "opens." The physical edge pins represent the actual physical locations where the interconnect passes from one submodule into another.

If the edge pins are assigned too early in the design cycle, the resulting thousands of fixed locations overly constrain the physical layout of the submodules. Also, maintenance of the thousands of edge pin locations and coordination of changes to them between many different submodule designers is a prohibitive design data management task that inhibits productivity. In addition, the constantly changing edge pin locations makes obtaining RC models of the global interconnect very difficult, especially during the early phases of the design cycle when many changes are occurring.

The present invention is directed to overcoming, or at least reducing the effects of, one or more of the problems set forth above.

SUMMARY OF THE INVENTION

One aspect of the present invention is seen in a method for constructing a global interconnect model of a device having ambiguous abutments between submodules. The method includes generating a discrete model for each of the submodules, identifying interconnections between the submodules, and defining a plurality of global abutment points for the interconnections between the submodules. Each global abutment point specifies a locus of interconnection points along at least a portion of a boundary of a particular one of the submodules. The discrete models are stitched together based on the global abutment points to construct a global interconnect model.

BRIEF DESCRIPTION OF THE DRAWINGS

The invention may be understood by reference to the following description taken in conjunction with the accompanying drawings, in which like reference numerals identify like elements, and in which.

Figure 1:
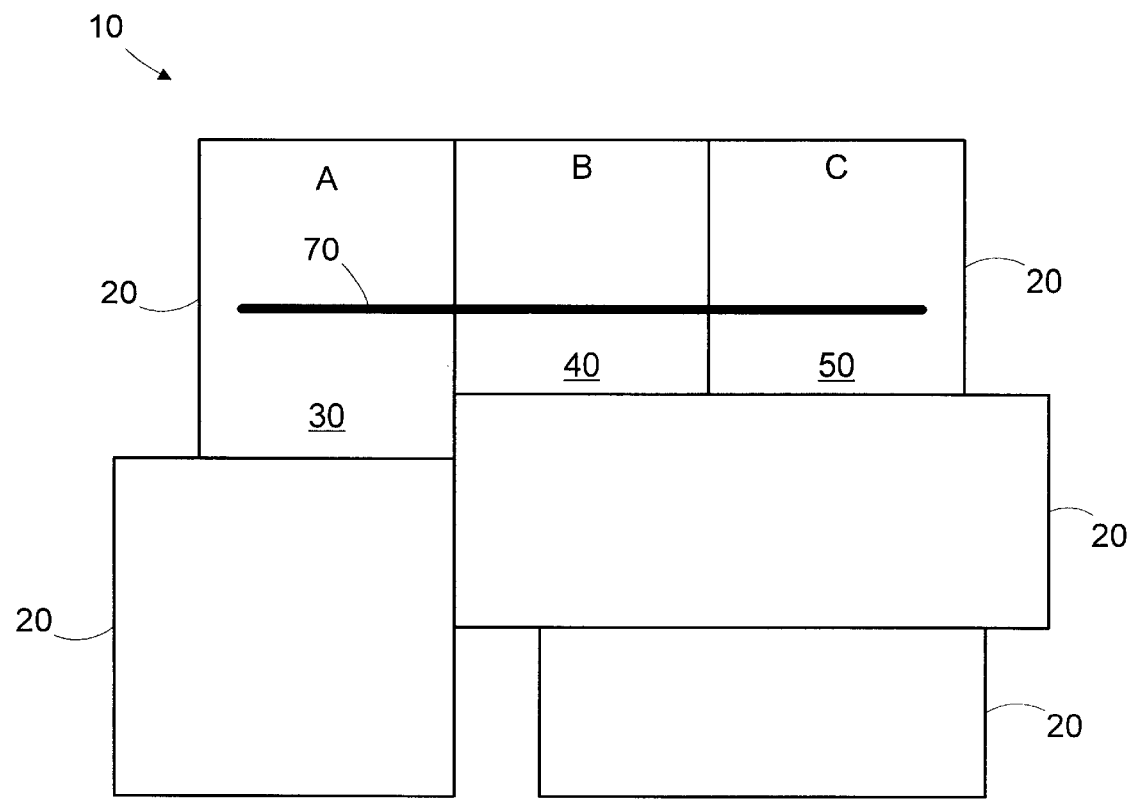
FIG. 1 is a simplified diagram of a floor plan of a semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the Figures, and, particularly, to FIG. 1, a simplified diagram of a floor plan 10 of a semiconductor device, such as a microprocessor, is provided. The floor plan 10 includes areas reserved for a plurality of submodules 20. For clarity and ease of illustration, the floor plan 10 is shown as a two-dimensional layout, and the submodules are shown with generally square edges. In an actual implementation, the floor plan 10 will consist of multiple interconnected layers and the edges of the submodules 20 may not be square.

Figure 2:
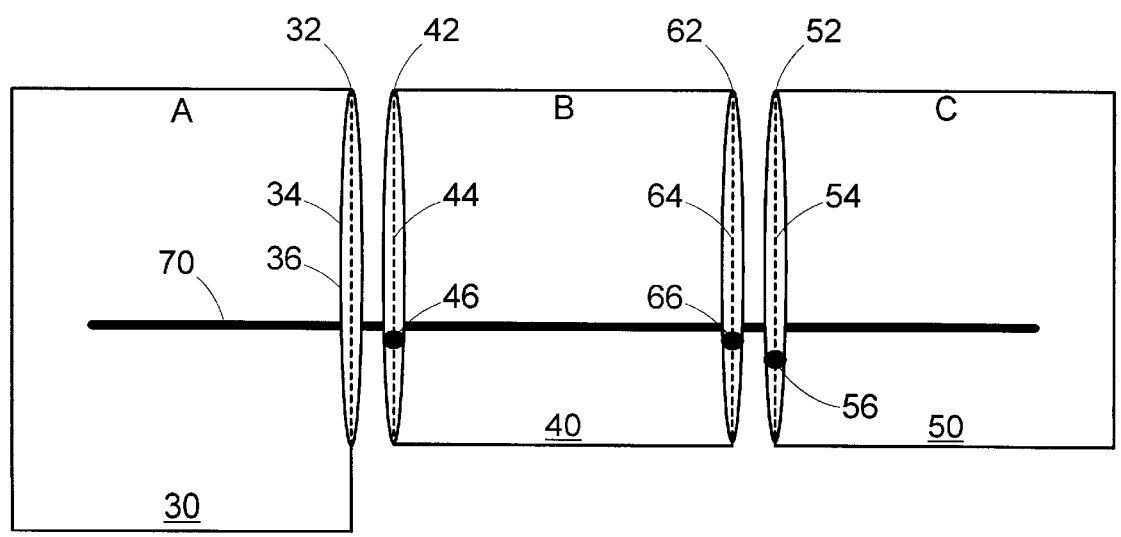
FIG. 2 is a simplified block diagram of three interconnected submodules in the floor plan of FIG. 1.

The interconnections between submodules 20 are defined using global abutment points (GAPs). Rather than being an exact location of an edge pin, a GAP represents an edge of the submodule along with a most probable location for an edge pin. Turning now to FIG. 2, a simplified block diagram of three interconnected submodules, 30, 40, 50 is provided. For clarity, the submodules 30, 40, 50 are illustrated as having spaces therebetween so that the definitions of GAPs for the submodules may be distinguished from one another. In an actual implementation the adjacent edges of the submodules 30, 40, 50 overlap.

A GAP 32, for the submodule 30 is defined by a particular edge 34 and a most probable location 36 along the edge 34. Likewise, a GAP 42, for the submodule 40 is defined by an edge 44 and a most probable location 46 along the edge 44, and a GAP 52, for the submodule 50 is defined by an edge 54 and a most probable location 56 along the edge 54. The submodule 40 has a second GAP 62 defined by an edge 64 and a most probable location 66 along the edge 64. The 40 GAPs 32, 42 define a global interconnection between the submodules 30, 40 and the GAPs 52, 62 define a global interconnection between the submodules 40, 50. Collectively, the GAPs 32, 42, 52, 62 define a global interconnect path 70 through the submodules 30, 40, 50.

Notice that the most probable locations 36, 46, 56, 66 do not line up with each other. As described in greater detail below, using a GAP model allows a global interconnect analysis to be completed along the global interconnect path 70 even though the exact edge pin locations of the submodules 30, 40, 50 have not been finalized. The naming convention used in the illustrated embodiment to reference a particular GAP is GAP#<netname>#<module right>#<module side>#<module left>#<module side>. The components in the GAP name specify the global interconnect path, NetX, the submodules A and B, the edges of submodules (right for A, left for B) involved in the interconnect. Although the GAPs 32, 42 have different most probable locations 36, 46, they have the same name.

Figure 3:
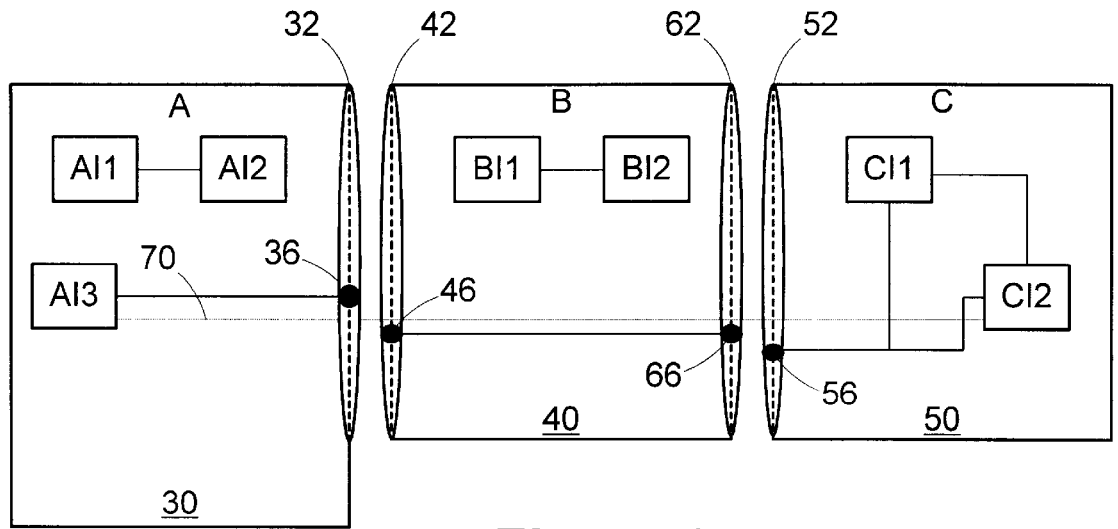
FIG. 3 is a simplified block diagram of the three interconnected submodules of FIG. 2 showing their internal circuit elements.

Turning to FIG. 3, a simplified block diagram of the three interconnected submodules, 30, 40, 50 showing their internal circuit elements is provided. The submodule 30 includes internal elements AI1, AI2, AI3. The internal elements AI1 and AI2 are interconnected, but do not have any interconnections with any adjacent submodules. The internal element AI3 interconnects through the GAPs 32, 42 to the submodule 40. The submodule 40 includes internal elements BI1, BI2. The internal elements BI1 and BI2 are interconnected, but do not have any interconnections with any adjacent submodules. The GAP 42 that interfaces with the GAP 32 of the submodule 30 connects through the GAP 62 to the GAP 52 of the submodule 50. The submodule 50 includes internal elements CI1, CI2. The internal elements CI1 and CI2 are interconnected, but both also interconnect through the GAPs 52, 62 to the submodule 40. The internal elements AI3, CI1, CI2 participate in the global interconnect path 70, while the internal elements AI1, AI2, BI1, BI2 do not.

Figure 4:
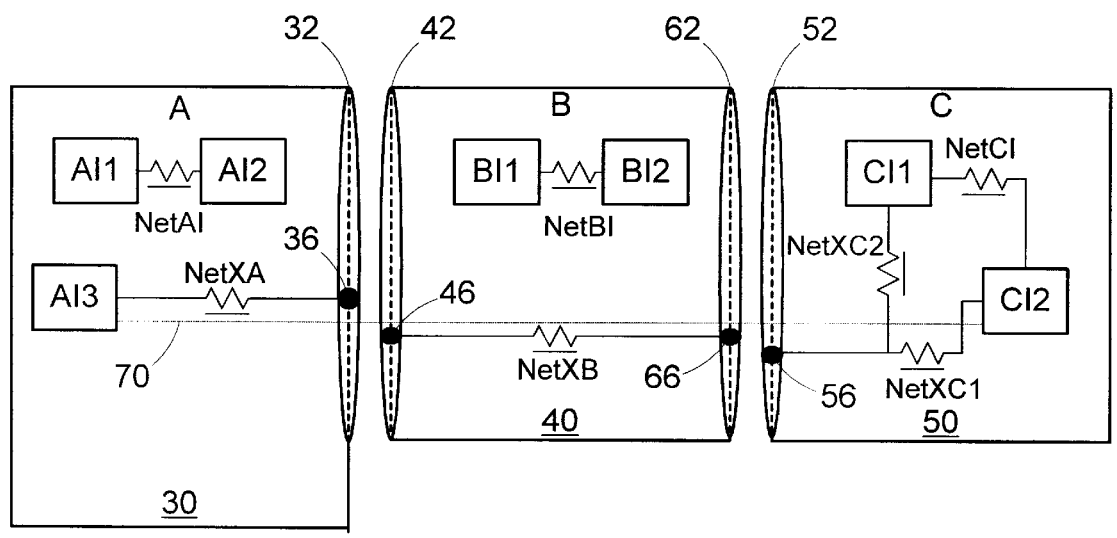
FIG. 4 is a circuit diagram illustrating RC models for the submodules of FIG. 3.

As shown in FIG. 4, RC models for the interconnections of the internal elements are determined separately using standard extraction tools. Each interconnection is treated as a discrete interconnect path. An exemplary extraction tool is a commercial CAD tool, such as Arcadia, offered by Synopsis, Inc. The extraction tool, based on knowledge of the physical structures in the submodule, models the RC parameters for the paths specified. For example, one RC model, denoted by NetXA, is generated for the path between the internal element AI3 and the GAP 32. Note that the point at which the line from AI3 exits the submodule 30 in the preliminary design represents the most probable location 36 used in the definition of the GAP 32. A separate RC model, NetXB is generated for the interconnection between the GAPs 42, 62 of the submodule 40, and still another separate RC model is generated for the submodule 50, denoted by NetXC1 and NetXC2. Notice that a single RC model of the global interconnect path 70 cannot be obtained from a single extraction of the entire chip until the GAPs 32, 42, 52, 62 are aligned to touch one another, which seldom occurs during design iterations of the submodules 30, 40, 50. However, extracted RC models of the submodules 30, 40, 50 may be obtained for each iteration of the design process. RC models for the internal elements AI1, AI2, BI1, BI2 not on the global interconnect path 70 may also be determined, denoted by NetAI, NetBI, NetCI.

Figure 5A:
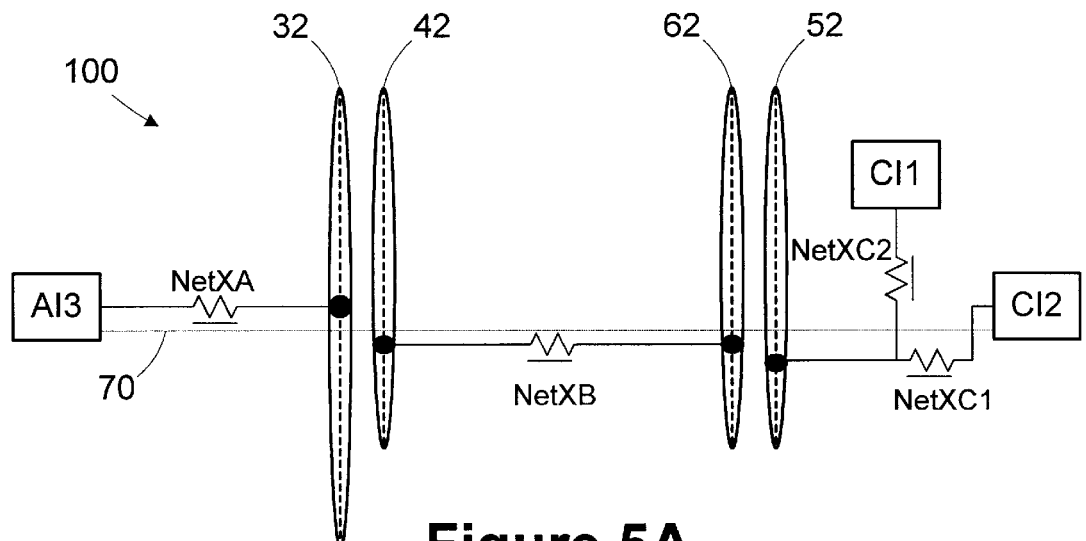
FIGS. 5A and 5B are simplified block diagrams showing global and internal interconnect models of the submodules of FIG. 4, respectively.
Figure 5B:
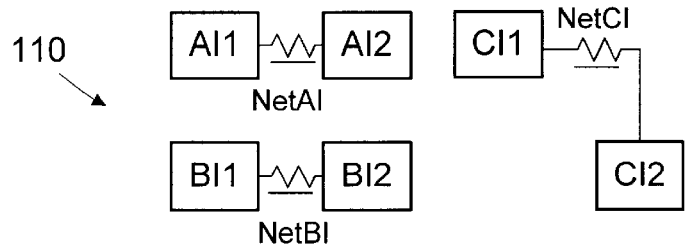

Turning to FIGS. 5A and 5B, block diagrams showing global and internal interconnect models, respectively, are provided. In FIG. 5A, a global interconnect model 100 is generated based on the discrete submodule RC models, NetXA, NetXB, NetXC1, NetXC2. As shown in FIG. 5B, local models 110 are generated for the internal interconnection models NetAI, NetBI, NetCI. Note that the global interconnect model 100 still includes the ambiguities due to potential misalignment of the GAPs 32, 42, 52, 62.

Figure 6:
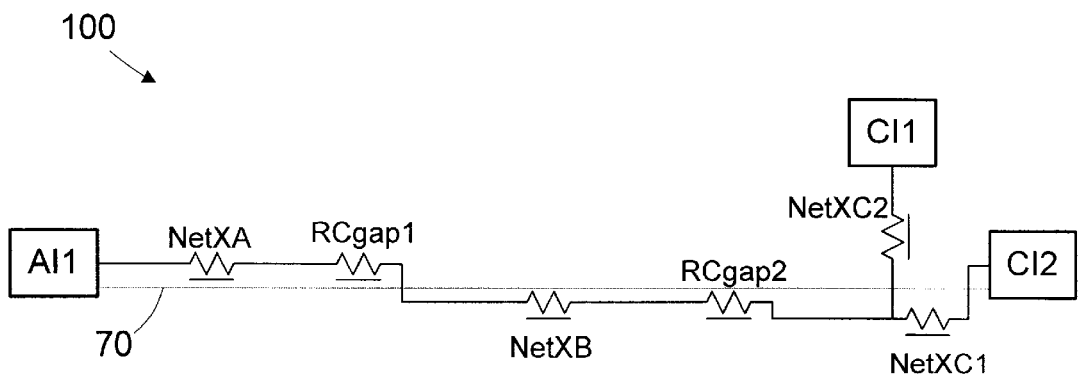
FIG. 6 is simplified block diagram of the global interconnect model of FIG. 5A including models of misaligned global abutment points.

As shown in FIG. 6, GAP RC models (RCgapn) are generated to bridge any misalignments. The following equations are provided to illustrate one technique for modeling the RC characteristics of the GAP misalignments. Those of ordinary skill in the art will recognize that other equations, with other parameters and scaling factors may be used. For purposes of this illustration, it assumed that the GAPs may have misalignments in two dimensions (i.e., X and Y). The most probable positions for the interfacing GAPs are used to generate the RCgap models. Exemplary equations for generating the RC models of the GAP misalignments are:

$$C_{GAP} = H_{CAP}*|x1-x2| + V_{CAP}*|y1-y2|, \quad (1)$$

and $$R_{GAP} = H_{RES}*|x1-x2| + V_{RES}*|y1-y2|, \quad (2)$$

where $H_{CAP}$ and $V_{CAP}$ represent horizontal and vertical incremental capacitance factors measured in fF (fempto farads) per mm, and $H_{RES}$ and $V_{RES}$ represent horizontal and vertical incremental resistance factors measured in ohms per mm. For illustrative purposes only, exemplary incremental capacitance and resistance factors are provided below. The specific factors used in a given implementation will vary depending on the particular construct and materials used in the device.

$$H_{CAP} = 2.73e-13 \text{ fF/mm}, \quad (3)$$

$$V_{CAP} = 2.51e-13 \text{ fF/mm}, \quad (4)$$

$$H_{RES} = 91 \text{ ohms/mm}, \quad (5)$$

and $$V_{RES} = 114 \text{ ohms/mm}. \quad (6)$$

The process of generating the RCgap models, denoted by RCgap1 and RCgap2 in FIG. 5A is referred to as stitching the discrete RC models NetXA, NetXB, NetXC1, NetXC2 together. Once stitched, a compete RC model of the global interconnect path 70 is available for performing a global timing analysis of the device. Throughout the design cycle, as GAPs and misalignments between them change, the RC model of the global interconnect path 70 may be updated and the global timing analysis may be repeated.

In one variation of the timing analysis described above, the RCgap values may be set to zero to facilitate a faster timing analysis (i.e., turbo stitch). If the RCgap values are small compared to the submodule RC models, NetXA, NetXB, NetXC1, NetXC2, a reasonable approximation of the timing may be achieved. In still another variation, only significant misalignments are modeled. For example, only misalignments greater than 1000 microns may be modeled, or alternatively, only RCgap values having RC values greater than a percentage (e.g, 10%) of the overall RC model for the global interconnect path 70 are considered.

An error checking function may also be integrated into the stitching process. For example, if a particular GAP does not have a corresponding GAP on an adjacent submodule, the hanging condition of the GAP may be flagged. Also, if the GAPs are associated with edges that do not completely overlap, the situation where the most probable point of one GAP does not lie on the interfacing edge of the other GAP may be flagged.

Figure 7A:
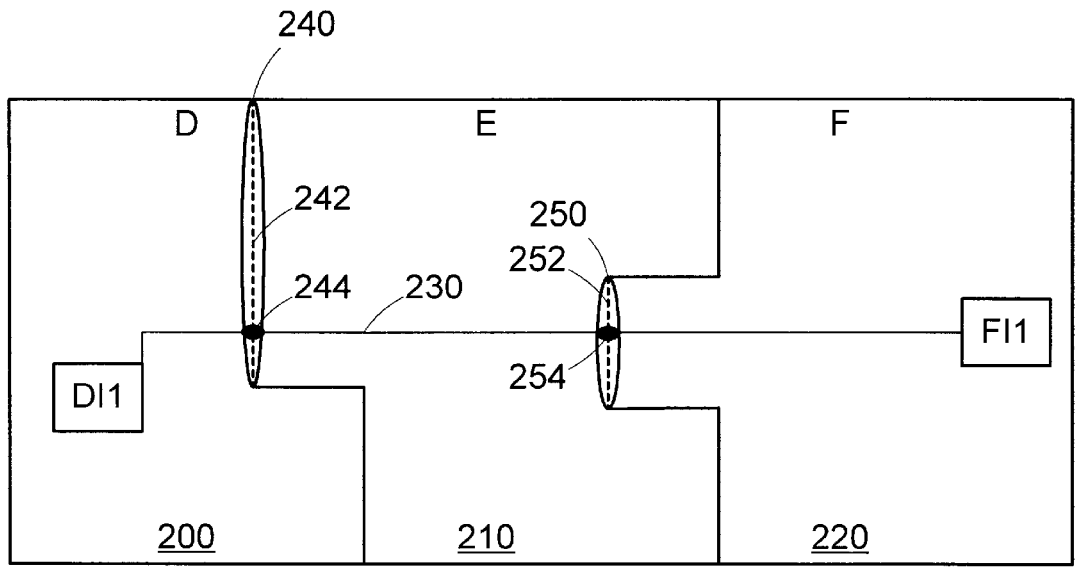
FIGS. 7A, 7B, and 7C are simplified block diagrams of interconnected submodules illustrating routing algorithms for forming the interconnections.
Figure 7B:
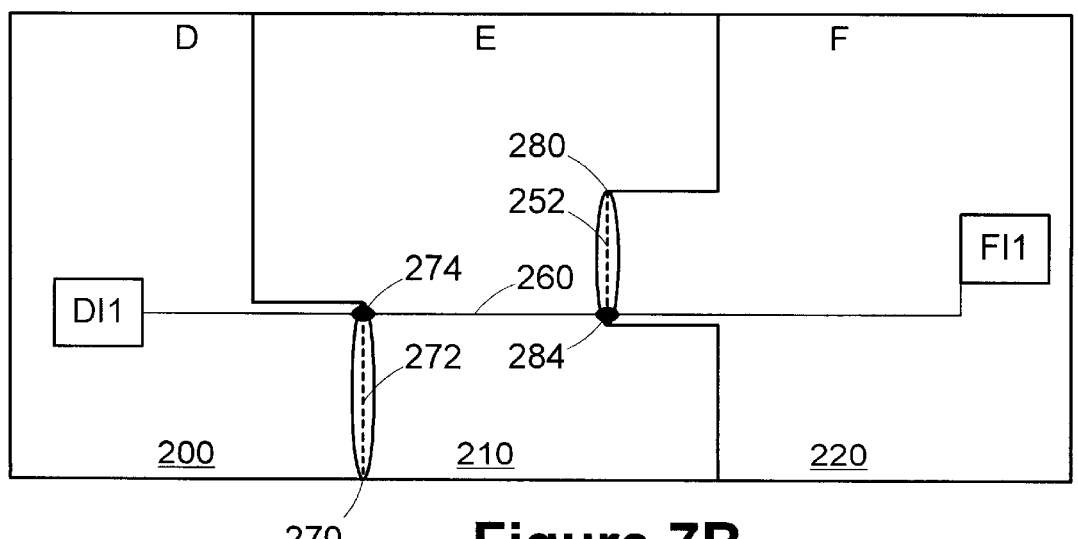
Figure 7C:
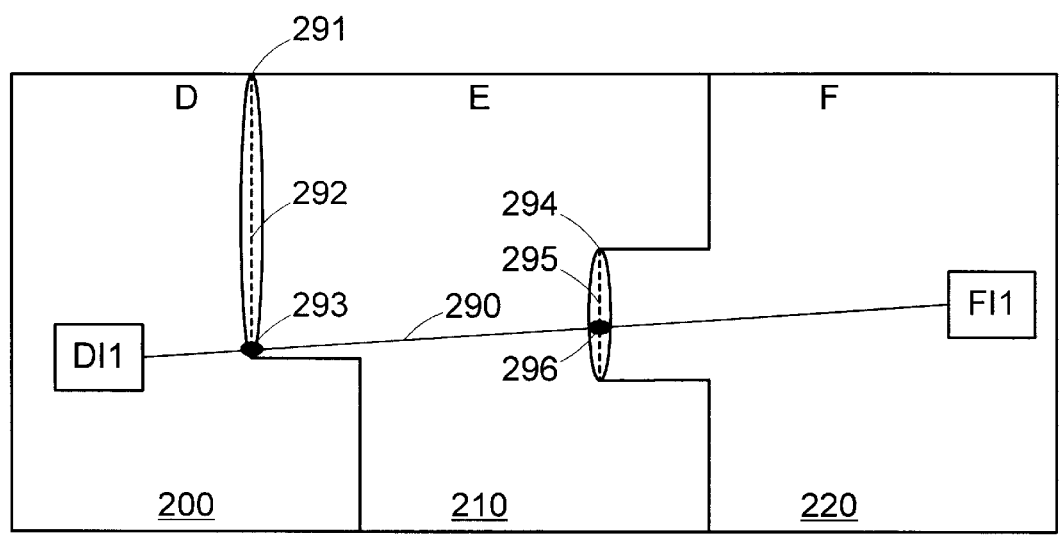

The previous example assumed that the GAPs for the submodules 30, 40, 50 have been predetermined. Referring to FIGS. 7A, 7B, and 7C simplified block diagrams of three submodules 200, 210, 220 showing their internal circuit elements is provided. An internal element DI1 of the submodule 200 is to be interconnected with an internal element FI1 of the submodule 220. The routing of interconnections between the internal elements DI1, FI1 may be performed manually, using a predetermined routing (prerouting), or automatically, using an automatic routing algorithm. Based on the routing, GAPs and most probable locations are determined for the global interconnection between the internal elements DI1, FI1. The pin locations for the internal elements DI1 and FI1 are known based on their designs.

An interconnection between the internal elements DI1 and FI1 may be routed automatically based on a vertical-first routing algorithm, as shown in FIG. 7A, based on a horizontal-first routing algorithm, as shown in FIG. 7B, or based on a flyline routing algorithm, as shown in FIG. 7C. Routing an interconnection 230 using the vertical-first routing algorithm results in a GAP 240 being defined on an edge 242 of the submodules 200, 210. A most probable location 244 is defined where the interconnection 230 intersects the edge 242. Likewise, a GAP 250 is defined on an edge 252 of the submodules 210, 220. A most probable location 254 is defined where the interconnection 230 intersects the edge 252. Note that only one GAP 240 is shown for the submodules 200, 210. In actuality two GAPs are defined that may diverge over time as the design progresses, but for the preliminary routing analysis they line up and only one is shown.

Routing an interconnection 260 using the horizontal-first routing algorithm (shown in FIG. 7B) results in a GAP 270 being defined on an edge 272 of the submodules 200, 210. A most probable location 274 is defined where the interconnection 260 intersects the edge 272. Likewise, a GAP 280 is defined on the edge 252 of the submodules 210, 220. A most probable location 284 is defined where the interconnection 260 intersects the edge 252. Note that the edge 252 of the submodules 210, 220 used in defining the horizontal-first GAP 280 is the same as that used in defining the vertical-first GAP 250 of FIG. 7A; however, the most probable locations 284, 254 differ. The GAPs 240, 270 have different associated edges and different most probable locations 244, 274.

Routing an interconnection 290 using the flyline routing algorithm (shown in FIG. 7C) results in a GAP 291 being defined on an edge 292 of the submodules 200, 210. A most probable location 293 is defined where the interconnection 290 intersects the edge 292. Likewise, a GAP 294 is defined on the edge 295 of the submodules 210, 220. A most probable location 296 is defined where the interconnection 290 intersects the edge 295. The edges 292, 295 on which the GAPs 291, 294 are defined are the same edges 242, 252 used in defining the vertical-first GAPs 240, 250 of FIG. 7A; however, the most probable locations 293, 296 differ.

After the GAPs are assigned as described above, subsequent stitching and timing analysis may be conducted as described above. Generating the routing information as described above is useful to designers of the intermediate submodules (i.e., submodules that have interconnections between other submodules passing through them). Identification of these "feed through" interconnections notifies the designer of the need to reserve adequate space in the submodule.

Figure 8:
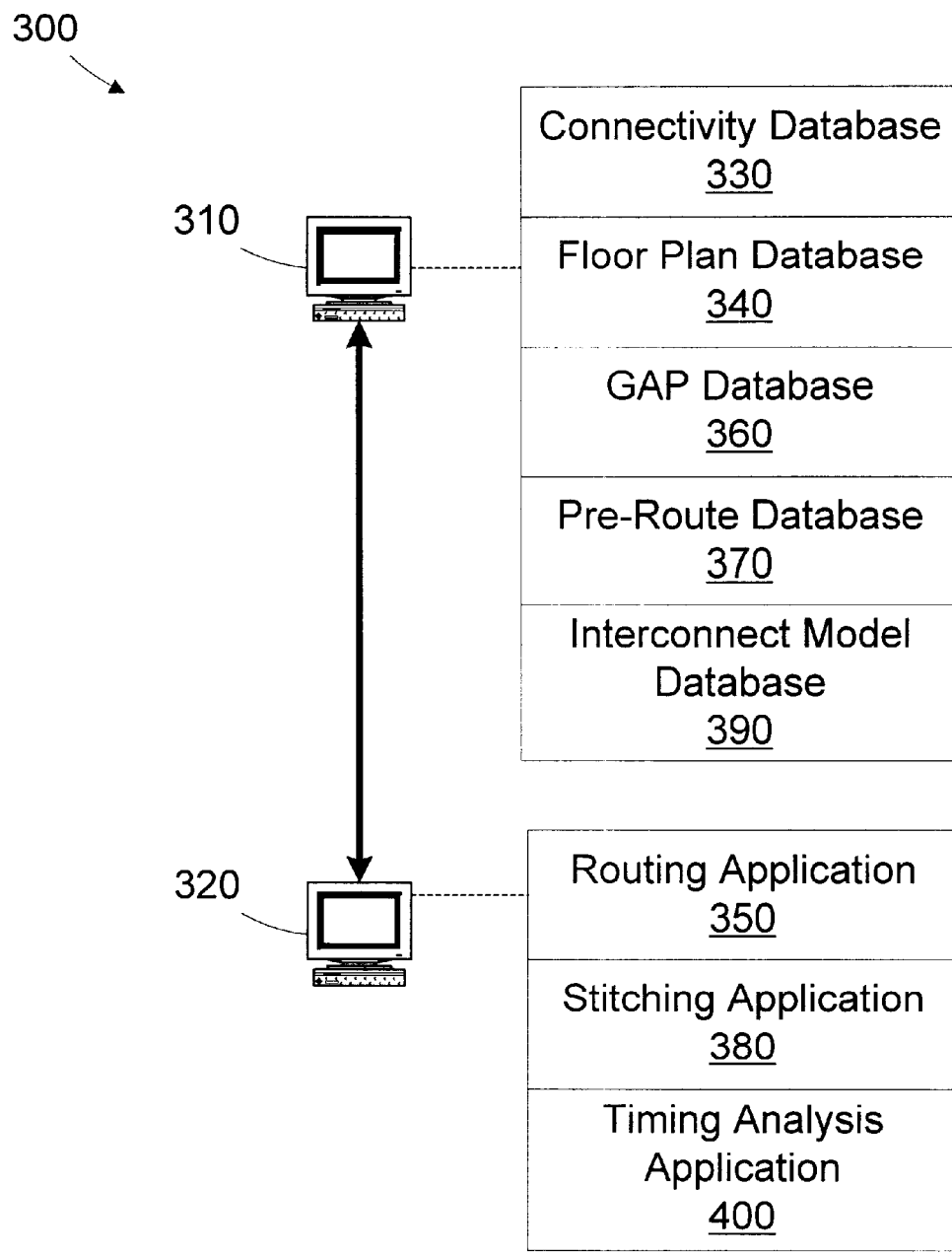
FIG. 8 is a simplified block diagram of one illustrative embodiment of a computer system in accordance with the present invention.

Turning now to FIG. 8, a simplified block diagram of one illustrative embodiment of a computer system 300 capable of implementing the present invention is provided. The computer system 300 includes a file server 310 for maintaining data stores of the relevant information and a computer 320 adapted to run the global interconnect timing analysis. Of course, one of ordinary skill in the art will recognize that these functions may be performed by a single computer or distributed among a network of computers without departing from the spirit and scope of the instant invention. The file server 310 includes a connectivity database 330 (i.e., netlist) that stores information regarding the devices and their connections, and a floor plan database 340 that defines the boundaries of each submodule 20. The computer 320 accesses the connectivity and floor plan databases 330, 340 and executes a routing application 350 to define GAPs for the interfaces between the submodules 20

(e.g., using a vertical-first or horizontal-first routing routine). The GAPs may be stored in a GAP database 360 on the file server 310. A user may influence the routing and GAP assignment stage by storing pre-route information in a preroute database 370. As the design changes, the computer 320 may re-evaluate the connectivity, floor plan, and pre-route databases 330, 340, 370 and adjust the GAPs. For consistency, the computer 320 attempts to maintain the GAP names as close as possible to the original names. Users may access the GAP database 360 at any point in the design process to determine the most likely interconnection positions for the various submodules 20. The computer 320 may also construct a model of the RC characteristics of the misaligned GAPs and global interconnect using a stitching application 380. The RC modeling information may be stored in an interconnect model database 390. The computer 320 may also execute a timing analysis application 400 to perform a global interconnect timing analysis using the stitched RC model information in the interconnect model database 390.

Defining the interfaces between submodules in a device layout using the uncertainties specified by GAPs has numerous advantages. First, during the entire design process, approximation of the global timing analysis may be generated to estimate the performance of the device. The impacts of changes to the floor plan or submodule internal arrangements on the global timing may be readily examined. Designers may use the GAP edge and most probable position information to guide them in their circuit designs. Routing information generated during the GAP assignment process can be used by a designer to identify interconnections from other submodules 20 that pass through the designer's own particular submodule 20.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for constructing a global interconnect model of a device having ambiguous abutments between submodules, comprising:

generating a discrete model for each of the submodules;

identifying interconnections between the submodules;

defining a plurality of global abutment points for the interconnections between the submodules, each global abutment point specifying a locus of interconnection points along at least a portion of a boundary of a particular one of the submodules; and stitching the discrete models together based on the global abutment points to construct the global interconnect model.

2. The method of claim 1, further comprising performing a timing analysis on the global interconnect model.

3. The method of claim 1, wherein stitching the discrete models includes:

identifying interconnections with misaligned global abutment points; and generating gap models for the interconnections with misaligned global abutment points; and combining the discrete models with the gap models.

4. The method of claim 1, wherein generating the discrete model comprises generating an RC model.

5. The method of claim 3, wherein generating the gap model comprises generating an RC model.

6. The method of claim 1, wherein the boundaries of the submodules include edges and defining the global abutment points includes specifying an edge of the associated submodule for each global abutment point.

7. The method of claim 6, wherein defining the global abutment points includes specifying a most probable position along the edge of the associated submodule.

8. The method of claim 3, wherein defining the global abutment points includes specifying a most probable position along the edge of the associated submodule, and stitching the discrete models includes identifying misalignments between the most probable positions of the global abutment points associated with the interconnection.

9. The method of claim 8, wherein generating the gap models includes:

determining an incremental resistance for the misaligned global abutment points; and determining an incremental capacitance for the misaligned global abutment points.

10. The method of claim 9, wherein generating the gap model includes setting the incremental resistance and capacitance to zero for misalignments less than a predetermined threshold.

11. The method of claim 9, wherein generating the gap model includes setting the incremental resistance and capacitance to zero for misalignments less than about 1000 microns.

12. The method of claim 9, wherein generating the gap model includes setting the incremental resistance and capacitance to zero for incremental resistance and capacitance values less than a predetermined percentage of the discrete models of the submodules.

13. The method of claim 1, further comprising identifying global abutment points associated with interconnections between non-adjacent submodules.

14. The method of claim 13, further comprising generating a discrete model for the portion of the interconnection passing through an intermediate submodule between the nonadjacent submodules.

15. A program storage device, including program instructions that, when executed by computer, perform a method for constructing a global interconnect model of a device having ambiguous abutments between submodules, the method comprising:

generating a discrete model for each of the submodules;

identifying interconnections between the submodules;

defining a plurality of global abutment points for the interconnections between the submodules, each global abutment point specifying a locus of interconnection points along at least a portion of a boundary of a particular one of the submodules; and stitching the discrete models together based on the global abutment points to construct a global interconnect model.

16. The program storage device of claim 15, wherein the method further comprises performing a timing analysis on the global interconnect model.

17. The program storage device of claim 15, wherein stitching the discrete models in the method includes:

identifying interconnections with misaligned global abutment points; and generating gap models for the interconnections with misaligned global abutment points; and combining the discrete models with the gap models.

18. The program storage device of claim 15, wherein the discrete model comprises an RC model.

19. The program storage device of claim 17, wherein the gap model comprises an RC model.

20. The program storage device of claim 1, wherein the boundaries of the submodules include edges and each global abutment points specifies an edge of the associated submodule.

21. The program storage device of claim 20, wherein each global abutment point includes a most probable position along the edge of the associated submodule.

22. The program storage device of claim 17, wherein each global abutment point includes a most probable position along the edge of the associated submodule, and stitching the discrete models in the method includes identifying misalignments between the most probable positions of the global abutment points associated with the interconnection.

23. The program storage device of claim 22, wherein generating the gap models in the method includes:

determining an incremental resistance for the misaligned global abutment points; and determining an incremental capacitance for the misaligned global abutment points.

24. The program storage device of claim 23, wherein generating the gap model in the method includes setting the incremental resistance and capacitance to zero for misalignments less than a predetermined threshold.

25. The program storage device of claim 23, wherein generating the gap model in the method includes setting the incremental resistance and capacitance to zero for misalignments less than about 1000 microns.

26. The program storage device of claim 23, wherein generating the gap model in the method includes setting the incremental resistance and capacitance to zero for incremental resistance and capacitance values less than a predetermined percentage of the discrete models of the submodules.

27. The program storage device of claim 15, wherein the method further comprises identifying global abutment points associated with interconnections between non-adjacent submodules.

28. The program storage device of claim 17, wherein the method further comprises generating a discrete model for the portion of the interconnection passing through an intermediate submodule between the non-adjacent submodules.

29. A system for constructing a global interconnect model of a device having ambiguous abutments between submodules, comprising:

means for generating a discrete model for each of the submodules;

means for identifying interconnections between the submodules;

means for defining a plurality of global abutment points for the interconnections between the submodules, each global abutment point specifying a locus of interconnection points along at least a portion of a boundary of a particular one of the submodules; and means for stitching the discrete models together based on the global abutment points to construct a global interconnect model.

* * * * *